(12) United States Patent
Udagawa et al.

(10) Patent No.: US 6,846,754 B2
(45) Date of Patent: Jan. 25, 2005

(54) BORON PHOSPHIDE-BASED SEMICONDUCTOR LAYER AND VAPOR PHASE GROWTH METHOD THEREOF

(75) Inventors: Takashi Udagawa, Saitama (JP); Koji Nakahara, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 26 days.

(21) Appl. No.: 10/369,556

(22) Filed: Feb. 21, 2003

(65) Prior Publication Data

US 2003/0162371 A1 Aug. 28, 2003

Related U.S. Application Data

(60) Provisional application No. 60/367,733, filed on Mar. 28, 2002.

(30) Foreign Application Priority Data

Feb. 22, 2002 (JP) ..................................... P2002-045510

(51) Int. Cl.[7] ....................... H01L 21/31; H01L 21/469; B05D 5/12
(52) U.S. Cl. ........................ 438/778; 439/909; 427/96; 427/99
(58) Field of Search ................................. 438/778, 909; 427/96, 99

(56) References Cited

U.S. PATENT DOCUMENTS

| 4,214,926 A | * | 7/1980 | Katsuto et al. | ............. 117/102 |
| 6,069,021 A | | 5/2000 | Terashima et al. | |
| 6,530,992 B1 | * | 3/2003 | Yang et al. | ................. 118/695 |

FOREIGN PATENT DOCUMENTS

| JP | 03-087019 | 4/1991 |
| JP | 04-084486 | 3/1992 |

* cited by examiner

Primary Examiner—Craig A. Thompson
Assistant Examiner—Nema Berezny
(74) Attorney, Agent, or Firm—Sughrue Mion, PLLC

(57) ABSTRACT

A vapor-phase growth method for forming a boron-phosphide-based semiconductor layer on a single-crystal silicon (Si) substrate in a vapor-phase growth reactor. The method includes preliminary feeding of a boron (B)-containing gas, a phosphorus (P)-containing gas, and a carrier gas for carrying these gases into a vapor-phase growth reactor to thereby form a film containing boron and phosphorus on the inner wall of the vapor-phase growth reactor; and subsequently vapor-growing a boron-phosphide-based semiconductor layer on a single-crystal silicon substrate. Also disclosed is a boron-phosphide-based semiconductor layer prepared by the vapor-phase growth method.

9 Claims, 2 Drawing Sheets under 35 U.S.C. § 111(b) pursuant to 35 U.S.C. § 119(e) (1).
BORON PHOSPHIDE-BASED SEMICONDUCTOR LAYER AND VAPOR PHASE GROWTH METHOD THEREOF

CROSS-REFERENCE TO RELATED APPLICATIONS

This application claims benefit of Provisional Application No. 60/367,733, filed Mar. 28, 2002, incorporated herein by reference, under 35 U.S.C. § 111(b) pursuant to 35 U.S.C. § 119(e) (1).

BACKGROUND OF THE INVENTION

1. Field of the Invention

The present invention relates to a technique for vapor growth of a boron-phosphide-based semiconductor layer which exhibits both of excellent surface flatness without microcracks and of excellent continuity on the surface of an underlying layer such as a single-crystal silicon substrate.

2. Description of the Related Art

Boron phosphide (BP) has been traditionally known as a Group III–V compound semiconductor (see "An Introduction to Semiconductor Device" by Iwao Teramoto, first edition, published by Baifukan Co., Ltd. on Mar. 30, 1995, p. 28). A crystal layer formed of a boron-phosphide-based semiconductor containing boron (B) and phosphorus (P), such as boron phosphide, has been employed as a buffer layer constituting a light-emitting device (see U.S. Pat. No. 6,069,021). Such a crystal layer has also been employed as a contact layer for forming an ohmic electrode (see Japanese Patent Application Laid-Open (kokai) No. 2-288388). Such a crystal layer has also been employed for forming a boron phosphide (BP)/gallium aluminum nitride ($Ga_xAl_{1-x}N$: $0 \leq X \leq 1$) superlattice layer serving as an active layer (light-emitting layer) of a laser diode (LD) (see Japanese Patent Application Laid-Open (kokai) No. 2-288388). The aforementioned superlattice layer formed of boron phosphide and a Group III nitride semiconductor layer containing nitrogen (N) has also been employed as a cladding layer for a light-emitting layer (see Japanese Patent Application Laid-Open (kokai) No. 2-288388).

A boron-phosphide-based semiconductor layer is formed on, for example, a single-crystal silicon substrate by a vapor-phase growth technique such as metal-organic chemical vapor deposition (MOCVD) (see U.S. Pat. No. 6,069,021). When boron phosphide is formed through MOCVD, triethylboran ($(C_2H_5)_3B$) and phosphine ($PH_3$), for example, are employed as raw materials (see U.S. Pat. No. 6,069,021). Boron phosphide has been known to be formed through halide vapor phase epitaxy employing halogenated compounds such as phosphorus trichloride ($PCl_3$) and boron trichloride ($BCl_3$) (see (1) J. Crystal Growth, 13/14 (1972), pp. 346–349 and (2) J. of Jpn Association of Crystal Growth, Vol. 25, No. 3 (1998), A, p. 28). Also, boron phosphide has been formed through hydride vapor phase epitaxy employing diborane ($B_2H_6$) and phosphine (see (1) J. Appl. Phys., 42 (1) (1971), pp. 420–424 and (2) J. Crystal Growth, 70 (1984), pp. 507–514).

Conventionally, a vapor-phase growth reactor formed of, for example, quartz has been employed for the formation of a boron-phosphide-based semiconductor layer on a single-crystal silicon substrate (see (1) "Handotai Gijutsu (Jo)" authored by Katsufusa Shohno, ninth printing, published by University of Tokyo Press on Jun. 25, 1992, pp. 74–76). A single-crystal silicon substrate is firstly placed on a susceptor provided in a vapor-phase growth reactor, and subsequently the susceptor or the silicon substrate is heated to a temperature suitable for formation of a boron-phosphide-based semiconductor layer. The temperature suitable for formation of a boron-phosphide-based semiconductor layer is known to be, for example, 900° C. to 1,250° C. (see the aforementioned "Handotai Gijutsu (Jo)," p. 76). Thereafter, through a conventional vapor-phase growth method for a boron-phosphide-based semiconductor layer, a gas source of a Group III element such as boron and a gas source of a Group V element such as phosphorus are fed into the vapor-phase growth reactor, to thereby initiate formation of a boron-phosphide-based semiconductor layer (see Inst. Phys, Conf. Ser., No. 129 (IPO Pub. Ltd., 1993, UK), pp. 157–162). Hydrogen gas ($H_2$) is employed for carrying the above gas sources into the vapor-phase growth reactor (see the aforementioned Inst. Phys, Conf. Ser., No. 129).

Meanwhile, a film of silicon nitride ($Si_3N_4$) or silicon dioxide ($SiO_2$) present on the surface of a single-crystal silicon substrate is known as a masking material to prevent growth of, for example, gallium nitride (GaN) thereon (see (1) J. Crystal Growth, 230 (2001), pp. 341–345 and (2) J. Crystal Growth, 230 (2001), pp. 346–350). By virtue of the aforementioned effect, a silicon nitride film or silicon oxide film is employed for masking the substrate so as to form a nitrogen-containing Group III nitride semiconductor layer on a selected region of the surface of the substrate (see "Group III Nitride Semiconductor," first edition, published by Baifukan Co., Ltd. on Dec. 8, 1999, pp. 122–124).

When the aforementioned $BP/Ga_xAl_{1-x}N$ ($0 \leq X \leq 1$) superlattice layer is formed through a conventional technique for formation of a boron-phosphide-based semiconductor layer, BP crystal layers and $Ga_xAl_{1-x}N$ ($0 \leq X \leq 1$) crystal layers are stacked alternately in the same vapor-phase growth reactor. When such a superlattice layer containing a nitrogen-containing Group III nitride semiconductor layer is formed in the same vapor-phase growth reactor, decomposition products containing Group III nitride semiconductor crystals are deposited onto the inner wall of the reactor, or a susceptor provided in the reactor. Nitrogen constituting the Group III nitride semiconductor layer readily vaporizes at a temperature of about 1,000° C. or above at which a boron-phosphide-based semiconductor layer has been conventionally formed (see J. Phys. Chem., 69 (10) (1965), pp. 3455–3460). Therefore, when the temperature of the vapor-phase growth reactor is raised so as to form a boron-phosphide-based semiconductor layer, nitrogen is released from the decomposition products (deposits) containing the Group III nitride semiconductor crystals in the vapor-phase growth reactor. Particularly, the sublimation temperature of indium nitride (InN) is as low as about 620° C. under vacuum (see "Compound Semiconductor Device" edited by Japan Industrial Technology Association, New Material Technology Committee, published by Kogyo Chosakai Publishing Co., Ltd. on Sep. 15, 1973, p. 397). Therefore, when the decomposition products contain indium nitride, considerable amounts of nitrogen atoms are released from the deposits in the vapor-phase growth reactor.

A portion of the nitrogen atoms released in the vapor-phase growth reactor at high temperature reacts with silicon at the surface of a single-crystal silicon substrate, to thereby form a silicon nitride film on the substrate. The thus-formed silicon nitride film impedes proper formation of the aforementioned Group III nitride semiconductor layer, as well as proper formation of a boron-phosphide-based semiconductor layer. Consequently, the resultant boron-phosphide-based semiconductor layer has a rough surface and exhibits discontinuities. When the boron-phosphide-based semiconductor layer formed on the surface of the single-crystal silicon substrate does not have the requisite surface flatness or continuity, a crystal layer exhibiting continuity and excellent surface flatness cannot be formed on the boron-phosphide-based semiconductor layer. When a light-emitting device, such as a light-emitting diode (LED), is produced from a stacked layer structure including a discontinuous crystal layer, the resultant LED exhibits a low forward voltage (i.e., Vf) and poor rectification characteristics, because of discontinuity of the crystal layer or non-flatness of a pn-junction interface.

SUMMARY OF THE INVENTION

The present invention has been accomplished in order to solve the aforementioned problems of the prior art. It is therefore an object of the present invention to provide a technique for suppressing release of a substance impeding formation of a boron-phosphide-based semiconductor layer on the surface of a single-crystal silicon substrate from decomposition products deposited onto the inner wall of a vapor-phase growth reactor. That is, an object of the present invention is to provide a vapor-phase growth method for formation of a boron-phosphide-based semiconductor layer exhibiting excellent surface flatness and continuity on the surface of a single-crystal silicon substrate.

The above objects of the present invention have been achieved by providing:

(1) A vapor-phase growth method for forming a boron-phosphide-based semiconductor layer on a single-crystal silicon (Si) substrate in a vapor-phase growth reactor, which comprises preliminary feeding of a boron (B)-containing gas, a phosphorus (P)-containing gas, and a carrier gas for carrying these gases into a vapor-phase growth reactor to thereby form a film containing boron and phosphorus on the inner wall of the vapor-phase growth reactor, and subsequent vapor-growth a boron-phosphide-based semiconductor layer on a single-crystal silicon substrate.

(2) A vapor-phase growth method for forming a boron-phosphide-based semiconductor layer according to (1) above, wherein the carrier gas contains argon (Ar) in an amount of at least 60 vol. %.

(3) A vapor-phase growth method for forming a boron-phosphide-based semiconductor layer according to (1) or (2) above, wherein the boron-containing gas contains an organic boron compound and no halogen element.

(4) A vapor-phase growth method for forming a boron-phosphide-based semiconductor layer according to any one of (1) through (3) above, wherein the phosphorus-containing gas contains a phosphorus hydride compound and no halogen element.

(5) A vapor-phase growth method for forming a boron-phosphide-based semiconductor layer according to any one of (1) through (4) above, wherein a susceptor on which a single-crystal silicon substrate is not mounted is placed in the vapor-phase growth reactor, and, while the susceptor is maintained at a temperature within a range of 500° C. to 1,200° C., the boron (B)-containing gas, the phosphorus (P)-containing gas, and the carrier gas for carrying these gases are fed into the vapor-phase growth reactor, to thereby form on the inner wall of the reactor a film containing boron and phosphorus.

(6) A vapor-phase growth method for forming a boron-phosphide-based semiconductor layer according to any one of (1) through (5) above, wherein, after a Group III nitride semiconductor is vapor-grown in the vapor-phase growth reactor, a film containing boron and phosphorus is formed on the inner wall of the vapor-phase growth reactor, and then a boron-phosphide-based semiconductor layer is vapor-grown on the surface of a single-crystal silicon substrate in the vapor-phase growth reactor.

(7) A vapor-phase growth method for forming a boron-phosphide-based semiconductor layer according to any one of (1) through (6) above, wherein, after a film containing boron and phosphorus is formed on the inner wall of the vapor-phase growth reactor, a single-crystal silicon substrate is mounted on a susceptor and is placed in the vapor-phase growth reactor, and the susceptor is heated to a temperature within a range of 250° C. to 1,200° C., to thereby vapor-grow a boron-phosphide-based semiconductor layer on the surface of the single-crystal silicon substrate.

The present invention also provides the following.

(8) A boron-phosphide-based semiconductor layer produced through a vapor-phase growth method as recited in any one of (1) through (7) above.

DETAILED DESCRIPTION OF THE INVENTION

Figure 1:
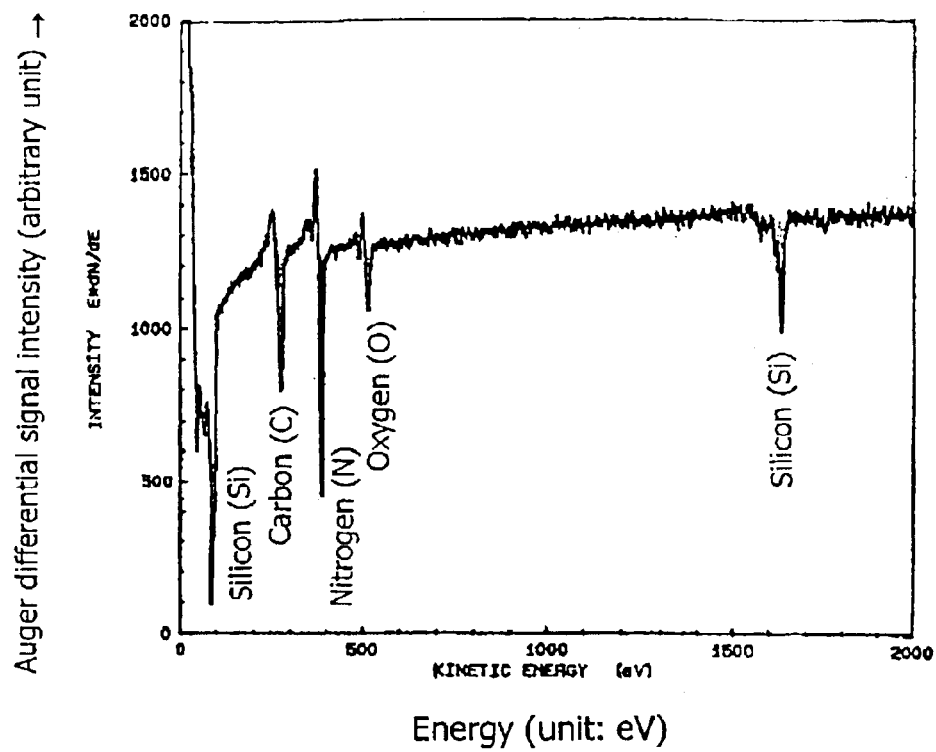
FIG. 1 shows the results of elemental analysis of the surface of a single-crystal silicon substrate prepared through a conventional technique.

The effects of the present invention are obtained particularly in the case where a boron-phosphide-based semiconductor layer is formed, through any vapor-phase growth technique (e.g., MOCVD, halide vapor phase epitaxy, or hydride vapor phase epitaxy), on the surface of a single-crystal silicon substrate in a vapor-phase growth reactor in which deposits containing nitrogen (N) or oxygen (O) are present. The substrate employed in the present invention may be formed of single-crystal silicon having a {100} crystal plane, a {110} crystal plane, or a {111} crystal plane. The substrate may also be formed of single-crystal silicon having a crystal surface plane which is inclined toward a specific crystal orientation. For example, the substrate may be formed of single-crystal silicon having a {111} plane as a crystal surface plane which is inclined by about 7° with respect to the <110> crystal direction. When the substrate is formed of single-crystal silicon of n- or p-conduction type, a positive or negative ohmic electrode can be provided on the bottom surface of the substrate, whereby a light-emitting device or a photo diode can be readily produced. Particularly, when the substrate is formed of an electrically conductive single-crystal material having a specific resistance (resistivity) as low as 1 mΩ·cm or less (preferably 0.1 mΩ·cm or less), the resultant substrate enables production of an LED having a low forward voltage (i.e., Vf). Since such substrate exhibits excellent heat radiation ability, it is effectively employed for producing an LD exhibiting stable radiation.

The boron-phosphide-based semiconductor layer provided on the single-crystal silicon substrate is formed of a material containing boron and phosphorus; for example, $B_A Al_B Ga_C In_D P_{1-\delta} As_\delta$ ($0<A\leq 1$, $0\leq B<1$, $0\leq C<1$, $0\leq D<1$, $A+B+C+D=1$, $0\leq \delta<1$), or $B_A Al_B Ga_C In_D P_{1-\delta} N_\delta$ ($0<A\leq 1$, $0\leq B<1$, $0\leq C<1$, $0\leq D<1$, $A+B+C+D=1$, $0\leq \delta<1$). The present invention is applicable to the boron-phosphide-based semiconductor layer formed on the surface of the single-crystal silicon substrate, regardless of the structure (i.e., amorphous, polycrystalline, or single-crystal) of the semiconductor layer. The effects of the present invention can be obtained regardless of the conduction type of a boron-phosphide-based semiconductor layer, the type of dopants which are intentionally added to the semiconductor layer for regulating the conduction type thereof, the carrier concentration, and the thickness of the semiconductor layer. The effects of the present invention can also be obtained when a nitrogen (N)-containing Group III nitride semiconductor layer is vapor-grown in a vapor-phase growth reactor and then a boron-phosphide-based semiconductor layer is formed thereon in the reactor, as well as when a boron-phosphide-based semiconductor layer is vapor-grown on the surface of a single-crystal silicon substrate as described above.

In a first embodiment of the present invention, before the aforementioned single-crystal silicon substrate is mounted on a susceptor, the inner wall of a vapor-phase growth reactor formed of, for example, quartz, stainless steel, or a ceramic material such as boron nitride (BN), is covered with a film containing boron and phosphorus. The expression "the inner wall of a vapor-phase growth reactor" refers to the inner walls constituting the reactor that face the substrate. Specifically, the aforementioned film is formed by feeding into the vapor-phase growth reactor a boron-containing gas, a phosphorus-containing gas, and a carrier gas for carrying these gases, while the susceptor formed of a heat-resistant material such as graphite or silicon carbide (SiC) is maintained at a temperature of 500° C. to 1,200° C. The thus-formed film covers a layer of nitrogen (N)-containing decomposition products deposited onto the inner wall of the vapor-phase growth reactor.

Examples of the boron-containing gas include triethyl boran (($C_2H_5$)$_3$B), borane ($BH_3$), and diborane ($B_2H_6$); and examples of the phosphorus-containing gas include phosphine ($PH_3$). The amount of phosphorus atoms which are supplied to the vapor-phase growth reactor for forming a film containing boron and phosphorus on the inner wall of the reactor is preferably greater than that of boron atoms. For example, the amount of phosphorus atoms supplied to the vapor-phase growth reactor is preferably at least about five times that of boron atoms, more preferably at least 10 times that of boron atoms. Phosphorus atoms are readily absorbed in a film containing a large amount of a Group III element such as boron. Therefore, when the amount of phosphorus atoms supplied to the reactor is smaller than that of boron atoms, a stoichiometrically balanced boron-phosphide-based semiconductor layer is not reliably formed.

The susceptor is heated by means of a technique such as a high-frequency heating method, a resistance heating method, or an infrared radiation heating method. The susceptor is heated for thermally decomposing a boron-containing gas and a phosphorus-containing gas which are fed into the vapor-phase growth reactor, to thereby generate boron and phosphorus for formation of a film. A boron- or phosphorus-containing gas may be thermally decomposed by means of a heating apparatus which is additionally provided on the vapor-phase growth reactor. However, the gases can readily be thermally decomposed by heating the susceptor already provided in the vapor-phase growth reactor. Generally, thermal decomposition of a boron- or phosphorus-containing gas proceeds insufficiently at a temperature lower than about 250° C., and a film containing boron and phosphorus fails to be formed efficiently on the inner wall of the vapor-phase growth reactor at such a low temparature. In order to form a film containing boron and phosphorus efficiently, the susceptor is preferably heated to 500° C. or higher, to promote thereby thermal decomposition of a boron-containing gas and a phosphorus-containing gas. However, at a temperature higher than 1,200° C., a highly volatile Group V element such as phosphorus is vaporized, and thus a film containing a large amount of a Group III element is formed. As a result, a boron-phosphide-based semiconductor layer of well-balanced composition (in terms of stoichiometric composition) is not formed.

When the temperature of the susceptor is increased within the aforementioned temperature range of 500° C. to 1,200° C. (i.e., the temperature range suitable for formation of a film), the amount of a phosphorus-containing gas fed into the vapor-phase growth reactor is preferable to increase with respect to that of a boron-containing gas fed into the reactor. This is done in order to prevent formation of a film containing a large amount of a Group III element (resulting from vaporization of phosphorus at a high temperature) on the inner wall of the vapor-phase growth reactor, and to form a film containing boron and phosphorus which completely covers the surface of deposits containing nitrogen (N). The thickness of the film containing boron and phosphorus is preferably at least about twice, more preferably at least about four times compared to the average thickness of a layer formed of deposits containing nitrogen (N). However, when the thickness of the film increases, the film is readily exfoliated from the inner wall of the vapor-phase growth reactor. When the film is exfoliated from the inner wall of the reactor during the course of vapor-phase growth of a boron-phosphide-based semiconductor layer, fragments of the film are deposited onto, for example, the surface of the single-crystal silicon substrate, and the resultant boron-phosphide-based semiconductor layer exhibits poor surface characteristics. Therefore, the thickness of the film is preferably less than about 10 times the average thickness of the deposits. The thickness of the film can be regulated by controlling the flow rate of a boron- or phosphorus-containing gas fed into the vapor-phase growth reactor. When the concentration of boron in a boron-containing gas is increased while the flow rate thereof is maintained, a film having a larger thickness can be formed.

In a second embodiment of the present invention, when a film containing boron and phosphorus is formed, a boron-containing gas and a phosphorus-containing gas are carried into the vapor-phase growth reactor using a carrier gas predominantly containing argon (Ar). This carrier gas is fed into the vapor-phase growth reactor together with a boron- or phosphorus-containing gas, and constitutes an atmosphere within the vapor-phase growth reactor. A characteristic feature of the second embodiment resides in that a film containing boron and phosphorus is formed in an atmosphere predominantly containing argon. The expression "carrier gas predominantly containing argon" refers to a carrier gas containing argon in an amount of 60 vol. % or more. Examples of such a carrier gas include argon gas (argon: 100 vol. %), and a gas mixture of 70 vol. % argon and 30 vol. % hydrogen ($H_2$). The percent volume of argon is represented by the ratio of the volume of argon to the entire volume of a carrier gas. A purpose of the present invention is to reduce the amount of nitrogen (N) or oxygen (O) released in the vapor-phase growth reactor. Therefore, employment of a gas mixture of argon and a nitrogen- or oxygen-containing gas, such as a gas mixture of argon and nitrogen ($N_2$), a gas mixture of argon and ammonia ($NH_3$), or a gas mixture of argon and oxygen ($O_2$), is not preferred. When such a gas mixture is employed, a masking film containing silicon nitride or silicon oxide (which impedes proper vapor-phase growth of a boron-phosphide-based semiconductor layer) is formed on the surface of the single-crystal silicon substrate.

The percent volume of argon of a gas mixture of argon and hydrogen can be varied by regulating the flow rate of argon with respect to the total flow rate of argon gas and hydrogen gas. When the percent volume of argon in a gas mixture of argon and hydrogen is less than 60%, hydrogen reacts with phosphorus contained in the aforementioned film, a phosphorus hydride of high vapor pressure is removed from the film, and the film is corroded rapidly and considerably. As a result, the thickness of the film is reduced, and the surface of deposits containing nitrogen is insufficiently covered with the film, whereby nitrogen is released in the vapor-phase growth reactor. An inert gas such as helium (He) or neon (Ne), which belongs to the same group as argon, may be employed as a carrier gas. However, from the viewpoint of economics, a carrier gas containing argon is most preferably employed for forming a film containing boron and phosphorus.

In a third embodiment of the present invention, when a film containing boron and phosphorus is formed, a non-halogen compound (i.e., a compound which does not contain a halogen element such as chlorine (Cl) or bromine (Br)) is employed as a boron-containing gas. Particularly, an organic boron compound containing no halogen element, such as trimethylboran (($CH_3)_3B$) or triethylboran (($C_2H_5)_3B$), is employed. When such an organic boron compound is employed, corrosion of the film (attributed to halogen radicals or halogen gas generated through thermal decomposition of a halogen-containing boron compound) can be avoided. Among aliphatic saturated boron compounds, triethylboran exhibits moderate vapor pressure at ambient temperature. Therefore, when triethylboran is employed, the ratio of the flow rate of triethylboran to that of a phosphorus-containing gas fed into the vapor-phase growth reactor can be readily regulated. An organic boron compound having a functional group containing a nitrogen (N) atom or an oxygen (O) atom is not suitably employed for formation of the film owing to the following reason: when such an organic boron compound is employed, a film containing nitrogen (N) or oxygen (O) is formed, and thus nitrogen or oxygen is released from the resulting film in the vapor-phase growth reactor.

In a fourth embodiment of the present invention, when a film containing boron and phosphorus is formed, a phosphorus-containing gas comprising a non-halogen compound (i.e., a compound which does not contain a halogen element such as chlorine (Cl) or bromine (Br)) is employed. Particularly, a phosphorus hydride containing no halogen element, such as phosphine ($PH_3$), is employed. When a halogenated phosphorus compound is employed, halogen is generated during the course of thermal decomposition of the compound, and the thus-generated halogen corrodes the film and reduces the thickness of the film, whereby the surface of deposits is incompletely covered with the film. Although phosphine shows Lewis basicity, it does not readily react with a Lewis acidic compound such as trimethylboran or triethylboran to form a complex. Therefore, since the amount of phosphine consumed in such reaction is reduced, phosphine can be supplied to the vapor-phase growth reactor in a desirable amount. A phosphorus hydride containing a nitrogen (N) atom or an oxygen (O) atom is not suitably employed for formation of the film owing to the following reason: when such a phosphorus hydride is employed, a film containing nitrogen (N) or oxygen (O) is formed, and nitrogen or oxygen is released in the vapor-phase growth reactor from the thus-formed film.

When phosphine is employed as the phosphorus-containing gas, hydrogen gas ($H_2$) is generated in the vapor-phase growth reactor through thermal decomposition of phosphine as described in the following reaction formula (1).

$$PH_3 \rightarrow P + \tfrac{3}{2}H_2 \qquad (1)$$

According to reaction formula (1), when $PH_3$ (1 mol) is thermally decomposed completely, hydrogen gas (1.5 mol) is aforementioned gas mixture of argon and hydrogen is employed as a carrier gas, the amount of the argon gas must be regulated such that the percent volume of the argon gas is 60% or more on the basis of the total volume of the argon gas and hydrogen gas constituting the gas mixture and hydrogen gas generated through thermal decomposition of phosphine. In general, the amount of hydrogen gas generated through thermal decomposition of phosphine should be estimated assuming that complete thermal decomposition of phosphine occurs; i.e., hydrogen gas (1.5 mol) is generated from $PH_3$ (1 mol).

After a film containing boron and phosphorus is formed on the inner wall of the vapor-phase growth reactor, in order to place a single-crystal silicon substrate on the susceptor, the susceptor is cooled to a temperature in the vicinity of room temperature. After the single-crystal silicon substrate is placed on a predetermined region of the susceptor which has been cooled, the substrate can be mounted thereon, and the substrate-mounted susceptor is then placed at a predetermined position of the vapor-phase growth reactor. The expression "predetermined position" refers to a position in the vapor-phase growth reactor at which the susceptor can be homogeneously heated efficiently to a temperature suitable for vapor growth of a boron-phosphide-based semiconductor layer. The susceptor is subsequently heated to a temperature suitable for vapor growth of a boron-phosphide-based semiconductor layer. A boron-phosphide-based semiconductor layer is formed on the single-crystal silicon substrate by means of a vapor-phase growth technique, such as MOCVD, halide vapor phase epitaxy, hydride vapor phase epitaxy, or gas-source molecular beam epitaxy (see J. Solid State Chem., 133 (1997), pp. 269–272).

An amorphous or polycrystalline boron-phosphide-based semiconductor layer is vapor-grown preferably at a temperature of 250° C. to 750° C. Meanwhile, a single-crystal boron-phosphide-based semiconductor layer is vapor-grown preferably at a temperature of 750° C. to 1,200° C. At a temperature higher than 1,200° C., polyhedral boron phosphides such as $B_6P$ and $B_{13}P_2$ are formed, and thus a boron-phosphide-based semiconductor layer of homogeneous composition fails to be vapor-grown. The temperature of the susceptor is measured and regulated by use of a temperature measuring apparatus such as a thermocouple or a radiation thermometer. When the susceptor (the single-crystal silicon substrate placed on the susceptor) is heated to a temperature suitable for vapor-growing a boron-phosphide-based semiconductor layer, the vapor-phase growth reactor is preferably filled with a gas mixture containing an inert gas (e.g., argon) in an amount of at least 60 vol. %. More preferably, the reactor is filled with a gas containing argon in 100 vol. %. The susceptor may be heated in a hydrogen atmosphere as in the case of a conventional technique. However, when the susceptor is heated in a hydrogen atmosphere, hydrogen reacts with the film containing boron and phosphorus deposited onto the inner wall of the vapor-phase growth reactor before vapor-phase growth of a boron-phosphide-based semiconductor layer, whereby the thickness of the film is reduced.

The effects of the present invention, in which a film containing boron and phosphorus is formed on the inner wall of a vapor-phase growth reactor, will be described with reference to the following analytical results. A sample for analysis was grown using a vapor-phase growth reactor which was utilized to grow a gallium indium nitride mixed crystal ($Ga_{0.90}In_{0.10}N$) layer having a thickness of 620 nm by MOCVD. As a result of this growth, a layer of decomposition products (average thickness: about 100 nm) was deposited on the inner wall of the reactor, particularly on a portion of the inner wall located in the vicinity of a susceptor. Subsequently, like the case of a conventional technique, a single-crystal silicon substrate having a {111} crystal plane was heated to 1,050° C. without a film containing boron and phosphorus being preliminarily formed on the inner wall of the vapor-phase growth reactor. The resultant substrate was subjected to elemental analysis. The results are shown in FIG. 1. Formation of a thin film on the surface of the thus-heated substrate was not observed clearly. According to Auger electron spectroscopy (AES), nitrogen (N), carbon (C), and oxygen (O) are, however, confirmed to be present as shown in a spectrum of FIG. 1. Therefore, difficulty is encountered in vapor growth of a boron-phosphide-based semiconductor layer exhibiting continuity and excellent surface flatness on the surface of the nitrogen-contaminated single-crystal silicon substrate. In general, a boron-phosphide-based semiconductor layer is formed having a rough surface on which spherical crystals are stacked in a disorderly manner on such a substrate.

Figure 2:
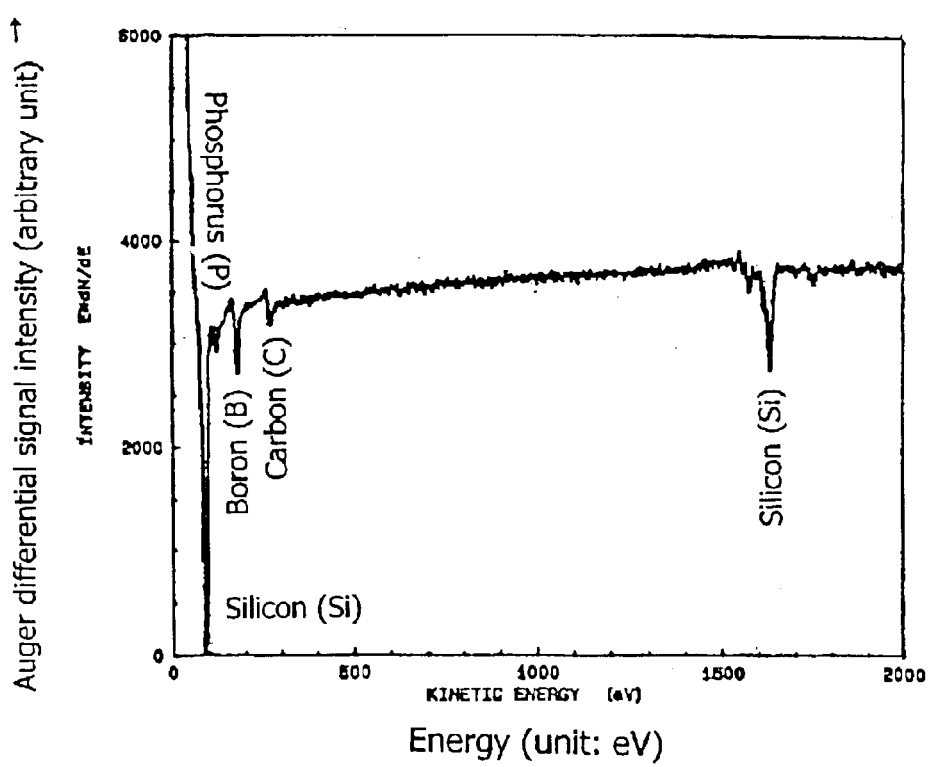
FIG. 2 shows results of elemental analysis of the surface of a single-crystal silicon substrate prepared through the method of the present invention.

Meanwhile, by means of the method of the present invention, a film containing boron and phosphorus (thickness: about 300 nm) was preliminarily formed on the inner wall of the aforementioned vapor-phase growth reactor, and subsequently a single-crystal silicon substrate having a {111} crystal plane was heated to 1,050° C. The resultant substrate was subjected to elemental analysis, and the results are shown in FIG. 2. As shown in an AES spectrum of FIG. 2, a small peak of AES signals attributed to carbon (C) was observed, in addition to the peak of AES signals attributed to silicon (Si) derived from the single-crystal silicon substrate. In addition, peaks of AES signals attributed to boron and phosphorus derived from the above-formed film were observed. Boron and phosphorus present on the surface of the single-crystal silicon substrate serve as "nuclei for growth" of a boron-phosphide-based semiconductor layer, and vapor-phase growth of a boron-phosphide-based semiconductor layer proceeds smoothly by virtue of the presence of these nuclei. The results show that the above-formed film exerts the effect of preventing contamination of the single-crystal silicon substrate surface with nitrogen (N) or oxygen (O) derived from decomposition products deposited onto the inner wall of the vapor-phase growth reactor. The aforementioned effect of the film; i.e., the effect of preventing contamination of the substrate surface with nitrogen (N) or oxygen (O), is also exerted in the case where a boron-phosphide-based semiconductor layer is vapor-grown after vapor-phase growth of a Group III nitride semiconductor layer. In this case, after completion of vapor-phase growth of the Group III nitride semiconductor layer (i.e., nitrogen-containing layer), a film containing boron and phosphorus must be formed before vapor-phase growth of the boron-phosphide-based semiconductor layer.

Operation:

A film containing boron and phosphorus which is formed on the inner wall of a vapor-phase growth reactor before vapor-phase growth of a boron-phosphide-based semiconductor layer exerts the effect of preventing contamination of the surface of an underlying substance originated from decomposition products deposited onto the inner wall of the reactor, which contamination impedes proper growth of the boron-phosphide-based semiconductor layer.

A carrier gas containing argon in an amount of at least 60 vol. % (which is employed when a film containing boron and phosphorus is formed on the inner wall of a vapor-phase growth reactor before vapor-phase growth of a boron-phosphide-based semiconductor layer) produces an argon-containing atmosphere in the reactor and exerts the effect of suppressing reduction in the thickness of the film.

An organic boron compound containing no halogen (which is employed when a film containing boron and phosphorus is formed on the inner wall of a vapor-phase growth reactor before vapor-phase growth of a boron-phosphide-based semiconductor layer) supplies boron constituting the film when being thermally decomposed, and exerts the effect of suppressing reduction in the thickness of the film.

A phosphorus hydride containing no halogen (which is employed when a film containing boron and phosphorus is formed on the inner wall of a vapor-phase growth reactor before vapor-phase growth of a boron-phosphide-based semiconductor layer) supplies phosphorus constituting the film when being thermally decomposed, and exerts the effect of suppressing reduction in the thickness of the film.

EXAMPLES

Example of the Invention

Figure 3:
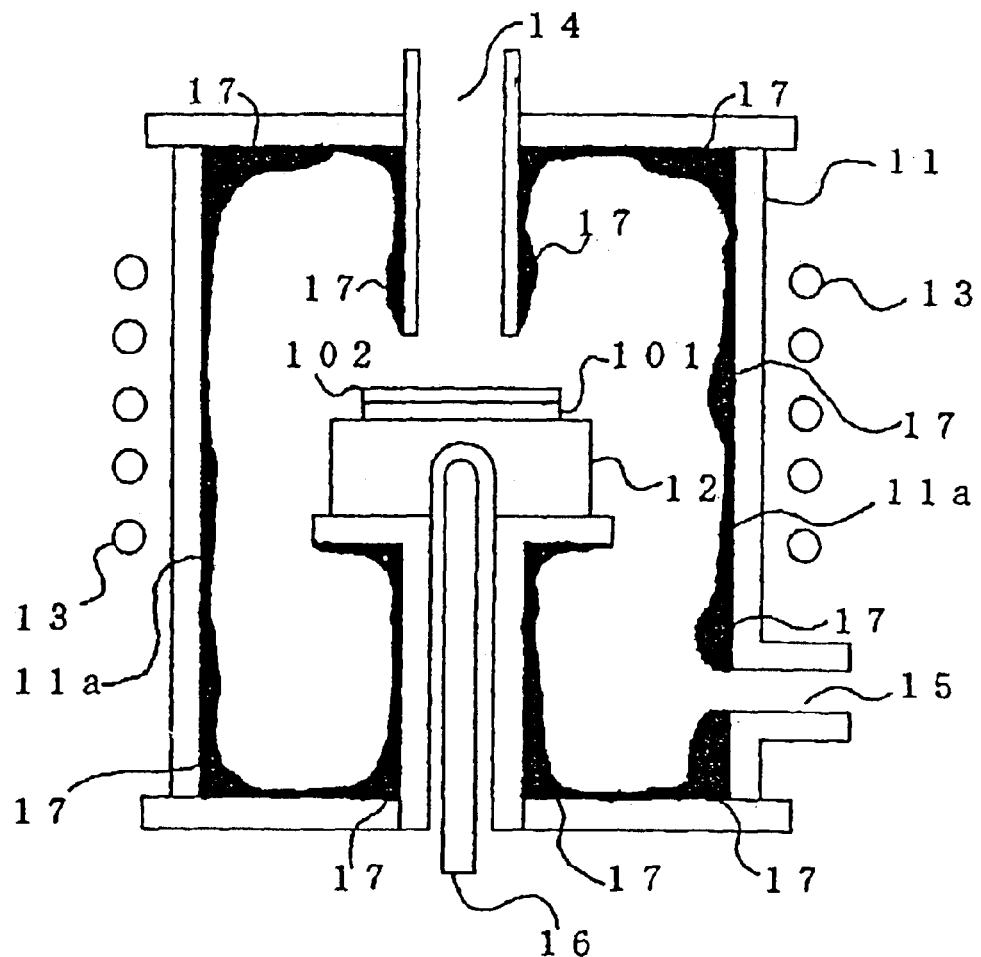
FIG. 3 is a schematic representation showing the structure of a vapor-phase growth reactor employed in the Example.

The present invention will now be described in detail by taking, as an example, the case where a boron monophosphide layer is vapor-grown directly on the surface of a boron-doped p-type single-crystal silicon substrate having a {111} crystal plane through MOCVD. FIG. 3 schematically shows the structure of an MOCVD vapor-phase growth apparatus employed in the present Example.

A vapor-phase growth reactor 11 of the vapor-phase growth apparatus shown in FIG. 3 is formed of a high-purity quartz tube for use in the semiconductor industry. In the center of the cylindrical vapor-phase growth reactor 11, a columnar susceptor 12 formed of high-purity graphite is provided for placing a substrate thereon. A high-frequency coil 13 for effecting high-frequency induction heating of the susceptor 12 is provided around the outer wall of the vapor-phase growth reactor 11 that is located in the vicinity of the susceptor 12. On an end of the vapor-phase growth reactor 11, an inlet 14 is provided for feeding into the reactor a boron- or phosphorus-containing gas and a carrier gas being employed for formation of a film containing boron and phosphorus or for vapor growth of a boron phosphide layer. On another end of the vapor-phase growth reactor 11, an outlet 15 is provided to exhaust the carrier gas and the gasses which have been fed into the reactor and which have passed along an inner wall 11a of the vapor-phase growth reactor 11 and around the susceptor 12 to the outside of the reactor.

In order to form a film according to the present invention, argon gas serving as a carrier gas was as first fed into the vapor-phase growth reactor 11 through the inlet 14 at a flow rate of 12 liters/minute. About 20 minutes after initiation of feeding of the argon gas, high-frequency power was applied to the high-frequency coil 13 to thereby heat the susceptor 12 having no single-crystal silicon substrate thereon from room temperature to 900° C. After the temperature of the susceptor 12 as measured by use of a thermocouple 16 provided in the susceptor 12 was recognized to be maintained at 900° C., triethylboran (($C_2H_5$)$_3$B) and phosphine ($PH_3$) were fed into the vapor-phase growth reactor 11 through the inlet 14 together with the aforementioned carrier gas (flow rate: 12 liters/minute). The flow rate of triethylboran was regulated to about 4 cc/minute, and the flow rate of phosphine was regulated to about 220 cc/minute. Keeping the pressure of the interior of the vapor-phase growth reactor 11 was maintained at about atmospheric pressure, triethylboran (($C_2H_5$)$_3$B) and phosphine ($PH_3$) were continuously fed into the vapor-phase growth reactor 11 over 60 minutes to thereby form a film 17 containing boron and phosphorus (thickness: about 400 nm) on the inner wall 11a of the vapor-phase growth reactor 11. The non-halogenated organic boron compound and the gas containing the non-halogenated phosphorus hydride were employed as the boron-containing gas and the phosphorus-containing gas, respectively. Therefore, considerable corrosion of the film was prevented, and the thickness of the film was increased so as to be almost proportional to the time of feeding of triethylboran (($C_2H_5$)$_3$B) and phosphine ($PH_3$).

Thereafter, feeding of triethylboran (($C_2H_5$)$_3$B) and phosphine ($PH_3$) into the vapor-phase growth reactor 11 was stopped, and the argon gas serving as a carrier gas was continuously fed alone into the reactor through the inlet 14 at the aforementioned flow rate. Subsequently, high-frequency induction heating of the susceptor 12 was stopped, and the susceptor 12 was cooled. After the susceptor 12 was cooled, the susceptor 12 was temporarily removed from the vapor-phase growth reactor 11, and a p-type single-crystal Si substrate 101 having a {111} crystal plane was placed on the center of the upper surface of the susceptor 12. Subsequently, the susceptor 12 on which the substrate 101 was placed was inserted again at a predetermined position of the vapor-phase growth reactor 11. Thereafter, the argon was fed into the vapor-phase growth reactor 11 through the inlet 14 at a flow rate of 12 liters/minute. The susceptor 12 was subsequently heated in an argon atmosphere to 850° C. through high-frequency induction heating means. Immediately after the susceptor 12 reached to a temperature of 850° C., the flow rate of the argon gas serving as a carrier gas was lowered from 12 liters/minute to 10 liters/minute before vapor-phase growth of a boron phosphide layer. Hydrogen gas (flow rate: 2 liters/minute) was added to the argon gas, and the resultant Ar—$H_2$ gas mixture (percent volume of argon: about 83.3%) was employed as a carrier gas.

After the Ar—$H_2$ gas mixture was fed into the vapor-phase growth reactor 11 for a predetermined period of time, triethylboran (($C_2H_5$)$_3$B) and phosphine ($PH_3$) were fed into the reactor together with the gas mixture. The flow rate of triethylboran (($C_2H_5$)$_3$B) was regulated to 4 cc/minute, and the flow rate of phosphine ($PH_3$) was regulated to 430 cc/minute. Through feeding of the boron-containing gas, the phosphorus (P)-containing gas, and the carrier gas for carrying these gases into the vapor-phase growth reactor 11, vapor-phase growth of a boron monophosphide layer 102 was initiated. The boron-containing gas, the phosphorus-containing gas, and the carrier gas for carrying these gases were continuously fed over eight minutes, to thereby vapor-grow the boron monophosphide layer 102 (thickness: 300 nm). Subsequently, feeding of the boron-containing gas and the phosphorus-containing gas was stopped to thereby complete vapor-phase growth of the boron phosphide layer 102, and then high-frequency induction heating of the susceptor 12 was stopped. After the susceptor 12 was cooled to a temperature in the vicinity of room temperature in an atmosphere of the Ar—$H_2$ gas mixture (percent volume of Ar: about 83.3%), the susceptor 12 was removed from the vapor-phase growth reactor 11, and the single-crystal silicon substrate 101 was removed from the susceptor.

The boron phosphide layer 102 which had been vapor-grown on the surface of the single-crystal silicon substrate 101 by means of the method of the present invention was found to have a flat surface having no hillocks and irregularities. In addition, the boron phosphide layer was found to exhibit excellent continuity.

Comparative Example

In the Comparative Example, the vapor-phase growth reactor 11 employed in the aforementioned Example was employed, and an attempt was made to effect vapor growth of a continuous boron monophosphide layer exhibiting excellent surface flatness on the surface of a single-crystal silicon substrate having a {111} crystal plane, without preliminary formation of a film containing boron and phosphorus on the inner wall 11a of the vapor-phase growth reactor 11. Vapor-phase growth of a boron phosphide layer was specifically performed under conditions such that a boron-containing gas, a phosphorus-containing gas, and a carrier gas were brought into direct contact with the inner wall 11a of the vapor-phase growth reactor 11.

In order to properly compare the case of Comparative Example with that of the aforementioned Example in which a film containing boron and phosphorus was formed in advance on the inner wall 11a of the vapor-phase growth reactor 11, a boron phosphide layer in the Comparative Example was formed on the single-crystal silicon substrate under the same vapor-phase growth conditions as those employed in the aforementioned Example.

Figure 4:
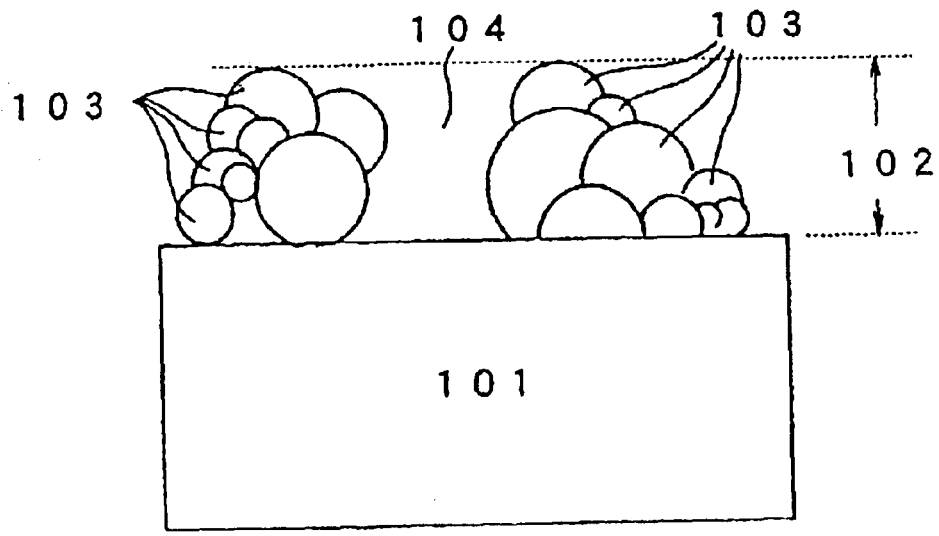
FIG. 4 is a schematic cross-sectional view showing the structure of a boron phosphide layer of the Comparative Example.

As a result, a continuous boron phosphide layer failed to be formed on the single-crystal silicon substrate, and the resultant boron phosphide layer was found to have a rough surface on which subspherical crystal grains were stacked one on another. FIG. 4 is a schematic cross-sectional view showing the boron phosphide layer 102 which was vapor-grown on the single-crystal silicon substrate 101 in the Comparative Example. As shown in FIG. 4, subspherical crystal grains 103 are not uniformly grown on the surface of the single-crystal silicon substrate 101, and are grown partially on the surface. Some of the subspherical crystal grains 103 do not adhere to one another, and a microcrack 104 is formed between the subspherical crystal grains 103.

The boron phosphide layer 102 was subjected to elemental analysis in its depth direction (thickness direction) by means of typical secondary ion mass spectrometry (SIMS). As a result, oxygen (O) atoms (atomic concentration: more than about $7 \times 10^{18}$ atoms/$cm^3$) were found to be accumulated on a region in the vicinity of the interface between the single-crystal silicon substrate 101 and the boron phosphide layer 102, particularly on a region on which the crystal grains 103 were not grown. The atomic oxygen concentration was about 10 times the concentration of oxygen atoms present on a region in the vicinity of the interface between the single-crystal silicon substrate of the aforementioned Example of the invention and the boron phosphide layer grown thereon. The analysis results showed that the concentration of oxygen atoms present on the surface of the substrate 101 of Example greatly differed from that of oxygen atoms present on the surface of the substrate 101 of Comparative Example. This suggests that the film containing boron and phosphorus affects the atomic oxygen concentration. As described above, even when decomposition products containing nitrogen (N) are not deposited onto the inner wall 11a of the vapor-phase growth reactor 11, the surface of the single-crystal silicon substrate is contaminated with oxygen derived from the reactor 11 formed of quartz. However, when the film containing boron and phosphorus is formed on the inner wall of the reactor, contamination of the surface of the substrate with oxygen can be effectively prevented.

Effects of the Invention

According to the present invention, after a film containing boron and phosphorus is formed in advance on the inner wall of a vapor-phase growth reactor, a boron-phosphide-based semiconductor layer is formed through a vapor-phase growth technique on an underlying substance such as a single-crystal silicon substrate. Therefore, contamination of the surface of the underlying substance, which impedes proper vapor-phase growth of a boron-phosphide-based semiconductor layer, can be prevented, and the resultant boron-phosphide-based semiconductor layer exhibits continuity and excellent surface flatness.

While the invention has been described in detail and with reference to specific embodiments thereof, it will be apparent to one skilled in the art that various changes and modifications can be made therein without departing from the spirit and scope thereof.

This application is based on Japanese Patent Application No. P2002-45510 filed Feb. 22, 2002, incorporated herein by reference in its entirety.

What is claimed is:

1. A vapor-phase growth method for forming a boron-phosphide-based semiconductor layer on a single-crystal silicon (Si) substrate in a vapor-phase growth reactor, which comprises preliminary feeding of a boron (B)-containing gas, a phosphorus (P)-containing gas, and a carrier gas for carrying these gases into a vapor-phase growth reactor to thereby form a film containing boron and phosphorus on an inner wall of the vapor-phase growth reactor, and subsequent vapor-growth of a boron-phosphide-based semiconductor layer on a single-crystal silicon substrate.

2. The vapor-phase growth method for forming a boron-phosphide-based semiconductor layer as claimed in claim 1, wherein the carrier gas contains argon in an amount of at least 60 vol. %.

3. The vapor-phase growth method for forming a boron-phosphide-based semiconductor layer as claimed in claim 1, wherein the boron-containing gas contains an organic boron compound and no halogen element.

4. The vapor-phase growth method far forming a boron-phosphide-based semiconductor layer as claimed in claim 1, wherein the phosphorus-containing gas contains a phosphorus hydride compound and no halogen element.

5. The vapor-phase growth method for forming a boron-phosphide-based semiconductor layer as claimed in claim 1, which comprises placing a susceptor on which a single-crystal silicon substrate is not mounted in the vapor-phase growth reactor, and, while maintaining the susceptor at a temperature within a range of 500° C. to 1,200° C., feeding the boron (B)-containing gas, the phosphorus (P)-containing gas, and the carrier gas for carrying these gases into the vapor-phase growth reactor, to thereby form on the inner wall of the reactor a film containing boron and phosphorus.

6. The vapor-phase growth method for forming a boron-phosphide-based semiconductor layer as claimed in claim 1, wherein, after vapor-growing a Group III nitride semiconductor in the vapor-phase growth reactor, said method comprises forming a film containing boron and phosphorus on the inner wall of the vapor-phase growth reactor, and then vapor-growing a boron-phosphide-based semiconductor layer on the surface of a single-crystal silicon substrate in the vapor-phase growth reactor.

7. The vapor-phase growth method for forming a boron-phosphide-based semiconductor layer as claimed in claim 1, wherein, after forming a film containing boron and phosphorus on the inner wall of the vapor-phase growth reactor, said method comprises mounting a single-crystal silicon substrate on a susceptor and placing the mounted substrate in the vapor-phase growth reactor, and heating the susceptor to a temperature within a range of 250° C. to 1,200° C., to thereby vapor-grow a boron-phosphide-based semiconductor layer on the surface of the single-crystal silicon substrate.

8. A boron-phosphide-based semiconductor layer prepared by the vapor-phase growth method as claimed in claim 1.

9. The vapor-phase growth method for forming a boron-phosphide-based semiconductor layer as claimed in claim 1, wherein said substrate is not present in the reactor in the preliminary feeding step, and the substrate is introduced into the reactor after forming a film containing boron and phosphorus on an inner wall of the vapor-phase growth reactor, for subsequent vapor-growth of a boron-phosphide-based semiconductor layer on the single-crystal silicon substrate.

* * * * *